United States Patent

[11] 3,624,461

[72] Inventor Toshiya Hayashi
North Plainfield, N.J.
[21] Appl. No. 564,071
[22] Filed July 11, 1966
[45] Patented Nov. 30, 1971
[73] Assignee Bell Telephone Laboratories, Incorporated
Murray Hill, N.J.

[54] TWO-VALLEY SEMICONDUCTOR OSCILLATOR
2 Claims, 6 Drawing Figs.

[52] U.S. Cl. 317/234 R, 317/234 N, 317/235 H, 307/299, 331/107 G
[51] Int. Cl. H01l 9/00
[50] Field of Search 317/234 (10); 331/107 G

[56] References Cited

UNITED STATES PATENTS 3,439,236 4/1969 Blicher 317/235
3,453,502 7/1969 Sandbank 317/235
3,365,583 1/1968 Gunn 317/234 (10)

OTHER REFERENCES

RCA Technical Notes, " Magnetic Tunning of Gunn Effect Oscillators" by Steele RCA TN No. 663 Nov. 1965 pages 1 and 2 331- 1076

*Primary Examiner*—Jerry D. Craig
*Attorneys*—R. J. Guenther and Arthur J. Torsiglieri

ABSTRACT: Modifications are disclosed in two-valley semiconductor oscillators, made of materials such as N-type gallium arsenide, that alter the characteristic oscillatory frequency of each device by changing the electric field within the device. Such changes are effected by varying the resistivity of the semiconductor material, either locally or continuously throughout the device; by altering the cross section of the device, either continuously or in steps; or by changing the point at which the field is applied to the semiconductor material.

INVENTOR
T. HAYASHI
BY Arthur J. Torsiglieri
ATTORNEY

TWO-VALLEY SEMICONDUCTOR OSCILLATOR

This invention relates to pulse generators and more particularly to such generators which employ as the active device a wafer of a two-valley compound semiconductor in which the transfer of high energy electrons between conduction-band valleys with different mobilities and separated in energy produces electrical instabilities.

The basic theory of "two-valley" semiconductor devices, as such devices will be designated herein for the sake of brevity, is set forth in detail in a number of papers in the special issue on semiconductor bulk-effect and transit time devices of the I.E.E.E. Transactions on Electron Devices, Jan. 1966.

In particular, it is known that if the voltage applied to a suitable wafer or element of an appropriate semiconductor, such as N-type gallium arsenide, is increased, the average sample current increases almost linearly to a maximum value and then drops suddenly to between about 60 and 90 percent of the maximum value and maintains this reduced value almost constant with further increases in voltage. Moreover, in this range of reduced value, the instantaneous current wave form is found to oscillate periodically at a frequency related to the sample length.

It is now understood that the oscillatory state is associated with the creation and travel of a high electric field domain through the wafer from the negative electrode, or cathode, to the positive electrode, or anode. Even if the applied voltage is dropped below the threshold voltage, the high field domain does not disappear but continues to drift toward the anode so long as the applied voltage is kept above a minimum sustaining value. More particularly, it appears that the oscillatory frequency is determined by the transit time of this traveling filed domain between the cathode and anode.

I have now found that this characteristic oscillatory frequency can be modified by introducing between the cathode and anode field perturbing influences, and the present invention relates to arrangements for disturbing the electric field controllably for achieving desired variations in the oscillatory frequency.

In one of the simplest forms, there is introduced along the sample between the cathode and anode at least one localized low resistivity region. Each such region can be made to introduce an additional pulse in the output circuit as the traveling field domain drifts therepast whereby the effective oscillatory rate in the output circuit is correspondingly increased.

In one embodiment of this form of the invention, a wafer of N-type gallium arsenide is provided with a pair of spaced connections for serving as the cathode and anode. The wafer is of relatively high resistivity type between said cathode and anode except for a localized lower resistivity region essentially midway between the cathode and anode. The wafer is connected to a suitable DC-voltage source and load such that oscillations are continuously generated in the load, which oscillations have a frequency essentially twice that which would normally result with a wafer of the same length in the absence of the low resistivity region between the cathode and anode connections.

In a variation of this form, a wafer of N-type gallium arsenide is modified to include along the path between its cathode and anode connections one localized low resistivity surface region on one side of such path and two localized low resistivity surface regions on the opposite side of such path. There is provided a magnetic filed whose direction can be switched whereby the current between the cathode and anode may be made to flow selectively along one or the other of the two opposite surfaces whereby for one orientation of the magnetic filed the output frequency is twice the fundamental frequency and for the other orientation the output frequency is three times the fundamental frequency. As a consequence, there results a generator whose frequency can be shifted abruptly between two different values.

Additionally, I have found that the pulse repetition rate may be increased by controlled extinction of the traveling domain before it completes its travel from the cathode to the anode. In particular, by arranging to have the electric filed fall below the value needed to sustain the traveling wave domain at some intermediate point, there is effectively reduced the path of travel and transit time with a consequent increase in repetition rate. Advantageously, in accordance with the invention, this decrease in filed is achieved by using a wafer in which the resistance per unit length decreases at some point between the cathode and anode. In such a device, the pulse repetition rate can be controlled by the voltage applied.

The full scope of the invention will be better understood from the following more detailed discussion taken in conjunction with the accompanying drawing in which.

Figure 1:
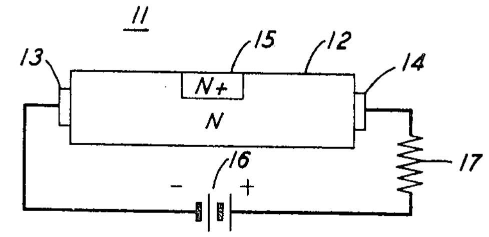
FIG. 1 shows a current pulse generator whose repetition rate is twice the fundamental rate in accordance with one embodiment of the invention.
Figure 4:
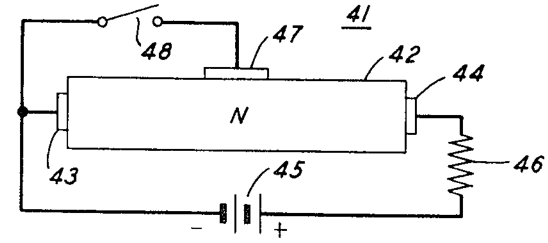
Figure 5:
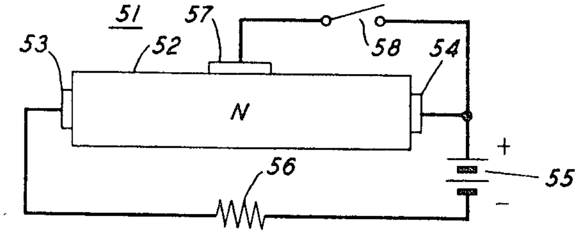
Figure 6:
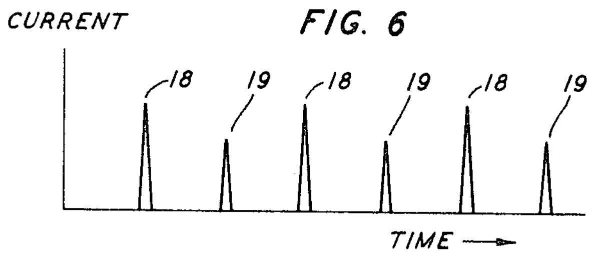

FIGS. 4 and 5 each show three-terminal devices which can be switched between oscillatory and nonoscillatory states by the action of the third element, in accordance with further embodiments of the invention; and FIG. 6 shows a waveform which will be helpful in explaining the operation of the generator shown in FIG. 1.

In the pulse generator shown in FIG. 1, the two-valley semiconductor device 11 comprises a semiconductive wafer 12 of a suitable material, such as N-type gallium arsenide, which is provided at opposite ends with cathode and anode connections 13 and 14. The wafer 12 includes a discrete region 15 midway between its ends in which the resistivity is at least 10 times lower than the bulk of the wafer which is otherwise of substantially uniform resistivity. The region 15 advantageously extends through a significant portion, such as twenty percent, of a cross section of the wafer although its extent can be varied over rather wide limits. Also advantageously it extends parallel to the current path between the cathode and anode about the width of the traveling domain which is determined primarily by the carrier concentration. A DC-voltage source 16 and a load 17 are connected between the cathode 13 and anode 14. The voltage source applies a voltage between the cathode and anode sufficient to give rise to a traveling field domain in the wafer in the manner characteristic of a two-valley semiconductor oscillator.

In FIG. 6 there is shown the waveform of the current flowing in the load under the conditions described. It is to be noted that the waveform includes a series of uniformly spaced pulses of which the odd-numbered pulses 18 are of slightly larger amplitude than the even-numbered pulses 19. Such odd-numbered pulses are the pulses characteristic of the normal two-valley semiconductor device operation and their repetition rate is controlled by the transit time of the traveling field domain between the transit time of the traveling field domain between the cathode and anode. Each corresponds to the change in current flowing through the load at the interval during the extinction of a traveling field domain and the launching of a subsequent domain. The even-numbered pulses correspond to the change in current flowing through the load during the interval the traveling field domain is passing through the region 15 of lower resistivity. By controlling the dimension and spacing of region 15 there can be controlled the shape and spacing of the even-numbered pulses. It can be seen that the inclusion of the even-numbered pulses has effectively doubled the pulse repetition rate or frequency of the oscillations.

It will be obvious that by introducing two regions of low resistivity between the cathode and anode still larger increases in the pulse repetition rate can be achieved. Moreover, a similar effect can be achieved by substituting conductive surface layers for the low resistivity regions.

An explanation of why the waveform depicted results is as follows. The region of the traveling filed domain corresponds to a region of high resistivity because it corresponds to a region in which the charge carriers have reduced mobilities. Accordingly, in the interval following the extinction of a traveling domain with its arrival at the anode and before the creation of a new domain at the cathode, the total resistance of the wafer is reduced and the current flow increased. This is the cause of the odd-numbered large amplitude pulses 18 in the waveform. Moreover, in the interval when the traveling domain is passing through the low resistivity region 15, its effective amplitude is reduced, with a consequent increase in the remainder of the sample and a larger average current through the sample. This gives rise to the even-numbered pulses 19. It is important, however, that the applied voltage is sufficient to insure that the field never falls below that needed to sustain the domain lest the domain be extinguished.

Figure 2:
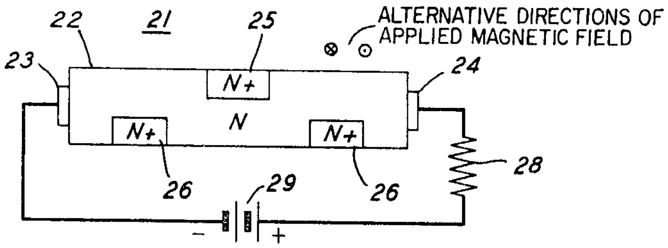
FIG. 2 shows a current pulse generator whose repetition rate can be switched from twice to three times the fundamental rate in accordance with another embodiment of the invention.

In FIG. 2 there is shown a pulse generator 20 whose repetition rate can be shifted between two different values. The semiconductive device 21 comprises a wafer 22 of suitable material which is provided at opposite ends with a cathode 23 and an anode 24. Additionally, along one surface there is provided a single region 25 of low resistivity halfway between the cathode and anode. On the opposite surface there are provided two regions 26 of low resistivity to divide the distance between the cathode and anode into three equal parts. A coil (not shown) provides a magnetic field perpendicular to the normal path of current flow in the wafer. A load 28 and a voltage source 29 are connected between the cathode and anode of the semiconductive device to establish a field therein in excess of the threshold value for creation of a traveling domain with resulting oscillations.

In this arrangement the direction of current flow through the coil and the direction of the magnetic field through the wafer determines adjacent which of the two opposite surfaces the current flow in the wafer will be concentrated. In one case, the traveling domain encounters essentially only the single-low resistivity region 25 and the resulting pulse repetition rate in the load is twice the fundamental rate. In the other case, the traveling domain penetrates essentially two low resistivity regions 26 and the resulting pulse repetition rate in the load is three times the fundamental rate.

Accordingly, the arrangement described represents a pulse generator whose repetition rate can be readily switched between two stable states.

Figure 3:
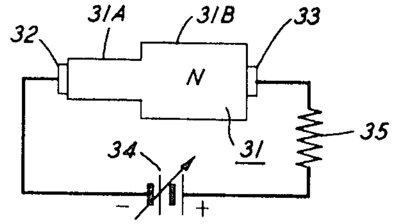
FIG. 3 shows a current pulse generator whose repetition rate can be varied by the applied voltage in accordance with another embodiment of the invention.

FIG. 3 shows a pulse generator in which the pulse repetition rate can be shifted between two values under control of the applied voltage. The semiconductive element 30 comprises the two-valley semiconductive wafer 31 which includes adjacent to the cathode 32 a portion 31A of smaller cross section than the portion 31B adjacent the anode 33. A variable voltage source 34 and load 35 are connected between the cathode and anode. As the voltage source is increased, there will be a range of voltages for which the electric filed in the wafer portion of smaller cross section will be sufficient for the propagation therein of a traveling domain but the electric field in the wafer portion of larger cross section will be insufficient to sustain the domain. This will result in the traveling domain being dissolved when it reaches the interface with the region of larger cross section. Accordingly, for this range of applied voltage, the pulse repetition rate will be determined by the length of and transit time in the region of smaller cross section. However, as the voltage applied is increased further, the electric filed in the region of larger cross section will also increase and, accordingly, there will be reached the point where the electric field in such portion is sufficient to sustain the traveling domain. In this range of applied voltage, the pulse repetition rate will be determined by the total separation between cathode and anode.

The discontinuity in resistance per unit length responsible for the change in electric field in the two regions of the wafer can obviously be achieved by utilizing material of different resistivity for the two regions rather than by varying the cross section of the wafer.

Similarly, it should be evident that by tapering the resistance per unit length, either by tapering the cross section or resistivity or both, a relatively continuous variation in frequency with variation in applied voltage can be achieved.

FIG. 4 shows a three-terminal arrangement 41 which can be adapted for use either for switching the device in an oscillatory state between a pair of different repetition rates or alternatively for switching the device between an oscillatory and nonoscillatory state depending on the applied bias. It includes a two-valley semiconductive element 42 which is provided with electrode connections 43 and 44 between which are connected the DC-voltage source 45 and the load 46. Additionally, auxiliary electrode 47 makes a low-resistance connection to the element intermediate between the electrodes 43 and 44 and this electrode 47 is connected to the electrode 43 by way of switch 48 which is shown as a mechanical switch, but which typically would be electronic, whose closing is controlled by some suitable information source.

For use by switching between two different repetition rates, the bias provided by source 45 is made sufficient to insure that the electric field in the element remains sufficiently high for traveling domain activity even if switch 48 is open. Under such conditions, closure of switch 48 merely makes electrode 47 the effective cathode in place of electrode 43 whereby the distance the traveling domain travels to the anode 44 is reduced and the repetition rate increased.

Alternatively, the bias provided by voltage source 45 can be chosen so that only when switch 48 is closed, making electrode 47 effectively the cathode, is the electric field in element 41 sufficient to sustain traveling domain activity. Under such conditions, the opening of switch 48 reduces the electric field in the element so that is is insufficient for the initiation of a traveling domain at cathode 43. As a consequence, closure of switch 48 serves to switch the circuit from a nonoscillatory state to an oscillatory state.

FIG. 5 shows an analogous three terminal device 51 in which the auxiliary electrode 57 is interconnected by way of switch 58 to electrode 54 whereby one or the other serves as the effective anode depending on whether or not the switch is closed or open. In other respects, the arrangement resembles that of FIG. 4, comprising a two-valley semiconductive element 52 provided at opposite ends with ohmic connections 53 and 54 and intermediate therebetween ohmic connection 57. Source 55 and resistor 56 are connected between electrodes 53 and 54. As before, the connections are such that upon closure of switch 58, the electrode 57 is at the potential of the source 55.

The considerations applicable to the FIG. 4 arrangement are similarly applicable and, depending on the applied bias, operation may be either on an off-on mode or in a variation of the repetition rate.

A number of embodiments have been described to point out the evident variety of forms that the invention can take. Moreover, there will appear to the worker in the art a number of other embodiments the invention can take without departing from the spirit of the invention. Typically it will be convenient to form the sample as a thin epitaxially grown layer on a substrate of higher resistivity material. By etching techniques, the grown layer can be shaped to the desired geometry.

Other arrangements involving use of an auxiliary electrode are described in copending applications of J. A. Copeland Ser. No. 564,080 (Case 11) now abandoned and M. Uenohara, Ser. No. 564,356 (Case 2) now U.S. Pat. No. 3,528,035 filed contemporaneously and having a common assignee.

I claim:

1. In a two-valley semiconductive pulse generator comprising a semiconducive element and means for establishing in the element an electric field sufficient to initiate a traveling electric field domain and to propagate the domain along said element, the pulse repetition rate of the pulse generator ordinarily being related to the distance the domain travels, the improvement characterized in the inclusion of means for modifying the pulse repetition rate from its value related to the distance the domain travels by increasing the output of the pulse generator during propagation of the domain, said means comprising a region of lower resistance per unit length than the resistance per unit length in the bulk of the semiconductive element that produces an increase in the output during the interval the traveling field domain is passing the region of lower resistance.

2. A pulse generator in accordance with claim 1 in which the modifying means is a region of lower resistivity than the resistivity in the bulk of the semiconductive element.

* * * * *